(12) United States Patent
Smith

(10) Patent No.: US 7,325,018 B2
(45) Date of Patent: Jan. 29, 2008

(54) DESIGN FLOW CHECKER

(75) Inventor: David Smith, Bristol (GB)

(73) Assignee: STMicroelectronics Limited, Almondsbury Bristol (GB)

( * ) Notice: Subject to any disclaimer, the term of this patent is extended or adjusted under 35 U.S.C. 154(b) by 42 days.

(21) Appl. No.: 09/769,004

(22) Filed: Jan. 24, 2001

(65) Prior Publication Data
US 2002/0042795 A1   Apr. 11, 2002

(30) Foreign Application Priority Data
Jan. 31, 2000   (GB) ................................. 0002174.1

(51) Int. Cl.
*G06F 17/30* (2006.01)
(52) U.S. Cl. ........................ 707/203; 707/200; 707/202
(58) Field of Classification Search ................ 707/200, 707/204, 3, 205, 202, 203; 703/23; 700/169; 726/16; 713/176; 709/203, 223, 213
See application file for complete search history.

(56) References Cited

U.S. PATENT DOCUMENTS

| | | | | |
|---|---|---|---|---|
| 4,667,290 | A | * | 5/1987 | Goss et al. .................. 717/147 |
| 5,138,713 | A | | 8/1992 | Loten .......................... 395/725 |
| 5,361,357 | A | * | 11/1994 | Kionka ....................... 707/200 |
| 5,778,390 | A | * | 7/1998 | Nelson et al. ............... 707/204 |
| 6,061,758 | A | * | 5/2000 | Reber et al. ............. 707/104.1 |
| 6,369,709 | B1 | * | 4/2002 | Larson et al. ............... 340/571 |

FOREIGN PATENT DOCUMENTS

EP          0 911 736          4/1999

OTHER PUBLICATIONS

Wall et al. Generatign verifiable microprosessrs state machine code with HDL Design Tools, Industrial Electronics society, vol. 3, p. 2441-2446, Nov. 2-6, 2003.*

(Continued)

*Primary Examiner*—Cam Y Truong
*Assistant Examiner*—Baoquoc N. To
(74) *Attorney, Agent, or Firm*—Lisa K. Jorgenson; James H. Morris; Wolf, Greenfield & Sacks, P.C

(57) ABSTRACT

A method is disclosed for operating a computer system in order to validate data stored in a plurality of data files in a database. Each of the data files have an associated file type and are arranged in a plurality of data stores in the database. At least one of the data files is a data dependent file which contains data dependent upon data in one or more other files of the data store. The method includes the steps of selecting a file locator which is associated with a respective one data store in the database, via the selected file locator identifying a first dependent file and identifying one or more other files on which said first file is dependent. For each identified file a first file reader is selected which is associated with the file type of the identified file. Via each selected first file reader a predetermined parameter of the identified file is determined. The method further includes the steps of comparing the predetermined parameter from the first file with that from the or each other file and responsive to the comparison step providing an output signal for each data file indicating whether the data file is valid.

27 Claims, 3 Drawing Sheets

OTHER PUBLICATIONS

Pflanz et al. On-line detection and correction in storage elements with cross-parity check, On-line Testing Workshop, pp. 1-5, Jul. 8-10, 2002.*

Vanbekbergen et al. A design and validation system for asynchronous circuits, Annual ACM IEEE Automation Conference, p. 725-730, 1995.☐☐.*

Ahdoot et al. IBM FSD VLSI chip desgin methology, Annual ACM IEEE Desgin Automation Conference, pp. 39-45, 1983.*

Pandey et al. Formal verification of PowerPC arrays using symbolic trajectory evaluation, Annual ACM IEEE Desgin Confrence, p. 649-654, 1996.*

Donald J. McGinnis Autocheck program, program to check vlidity of printed circuit cards and circuit, ACM/CSC-ER, Proceeding of the ACM annual confernce, vol. 1, p. 398-420, year2 1972.*

Kern et al. Formal verification in hardware desgin: a survey, ACM Transactions on Design Automation of Electronic System (TODAES), vol. 4, Issue 2, pp. 123-193, 1999.*

Michel Dubois, *Memory Access Dependencies in Shared-Memory Multiplexers*, IEEE Transactions on Software Engineering, vol. 16, No. 6, Jun. 1990, pp. 661-673.

Michael Dubois, *Memory Access Dependencies In Shared-Memory Multiplexers*, IEEE Transactions on Software Engineering, vol. 16, No. 6, Jun. 1990, pp 661-673.

* cited by examiner

DESIGN FLOW CHECKER

The present invention relates to a method of verifying the validity of data files in a computer data base. In particular the invention relates to a method of validating the data used to create a semiconductor chip prior to its manufacture.

When an integrated circuit or chip is sent to be manufactured various checks need to be made to ensure that the data used to create the chip is correct and up-to-date. For example, consider the case where the data in a first file is dependent upon data in a second file. If the second file is modified after the first file then the first file may be invalid as its contents may be incompatible with the second file on which it depends. As a consequence a part of the chip whose layout and function is dependent upon the data in the two files may be inoperative. This may not be compatible with a second component which could lead to chip failure. Therefore in order to ensure that all data files are compatible a check must be carried out to check when files which are dependent upon the content of other files were last modified. If the dates of last modification are different, potential problems can be identified. These checks are carried out before the chip is sent for manufacture. In this way self-consistency of the data corresponding to a block as it moves through each stage of the design flow can be ensured.

In the past this has been a laborious process that has required the user to create a checklist of every file contained within the database, the last modification date of every file, and the dependencies between the files. The user then has to check that every dependent file in the database has a later or the same date (and consequently takes into account amendments made to the file on which it depends) than the files on which it depends. Since each library can contain a hundred or more files, this is a long and laborious process which further more is prone to the usual human errors. In view of this, the checking process has in the past been carried out only once, immediately prior to chip creation. This itself presents the problem that invalid data is discovered at a relatively late stage of manufacture which can prove difficult to correct without delaying chip production.

It is an aim of embodiments of the present invention to at least partly mitigate the above-referenced problems.

In accordance with a first aspect of the present invention there is provided a method of operating a computer system to validate the data stored in a plurality of data files in a database each of said data files having an associated file type and being arranged in a plurality of data stores in said data base, wherein at least one of said data files is a data dependent file containing data dependent on data in one or more other files of said data store, said method comprising the steps of selecting a file locator which is associated with a respective one data store in said data base, via said selected file locator identifying a first dependency file and identifying one or more other files on which said first file is dependent, for each identified file, selecting a first file reader associated with the file type of the identified file, via each said selected first file reader, determining a predetermined parameter of said identified file, comparing the predetermined parameter from the first file with that from the or each other file, and responsive to said comparison step, providing an output signal for each data file indicating whether the data file is valid.

In accordance with a second aspect of the present invention there is also provided a computer system arranged to validate data stored in a plurality of data files in a data base each of said data files having an associated file type and being arranged in a plurality of data stores in said data base, wherein at least one of said data files is a data dependent file containing data dependent on data in one or more other files of said data base, said system comprising a plurality of file locators each associated with a respective data store in said data base and arranged to identify a first data dependent file in said associated data store and one or more other files in said data base on which said first file is dependent, a plurality of file readers each associated with a respective file type and each arranged to determine a predetermined parameter for at least one identified file having that associated file type, comparison means arranged to compare the predetermined parameter determined for said first file, with the predetermined parameter determined for each other file, and output means responsive to said comparison means and having an output which indicates whether said first file is valid.

Embodiments of the present invention will now be described hereafter by way of example only with reference to the accompanying drawings in which.

In the drawings like reference numerals refer to like parts.

A specific design database checking system called DBVerify which embodies the invention will now be described. This system enables the user to set up a checking tool to check a particular design database, and, if necessary, customise the tool to check any particular non-standard features of the database.

The database checker can be used at the library level, that is to check that the library is consistent with itself, and that all the necessary checks on the library have been performed correctly. Data is organised into different "libraries". These libraries (or data stores) generally reflect different stages in the design process or are related to one particular tool. The libraries each store a plurality of files. These files include information defining the function and/or layout of a part of the integrated circuit which is being designed and the date that the file was last modified.

In alternative embodiments of the invention the database checker can check for inconsistencies between libraries or to check for inconsistencies throughout the device.

Figure 1:
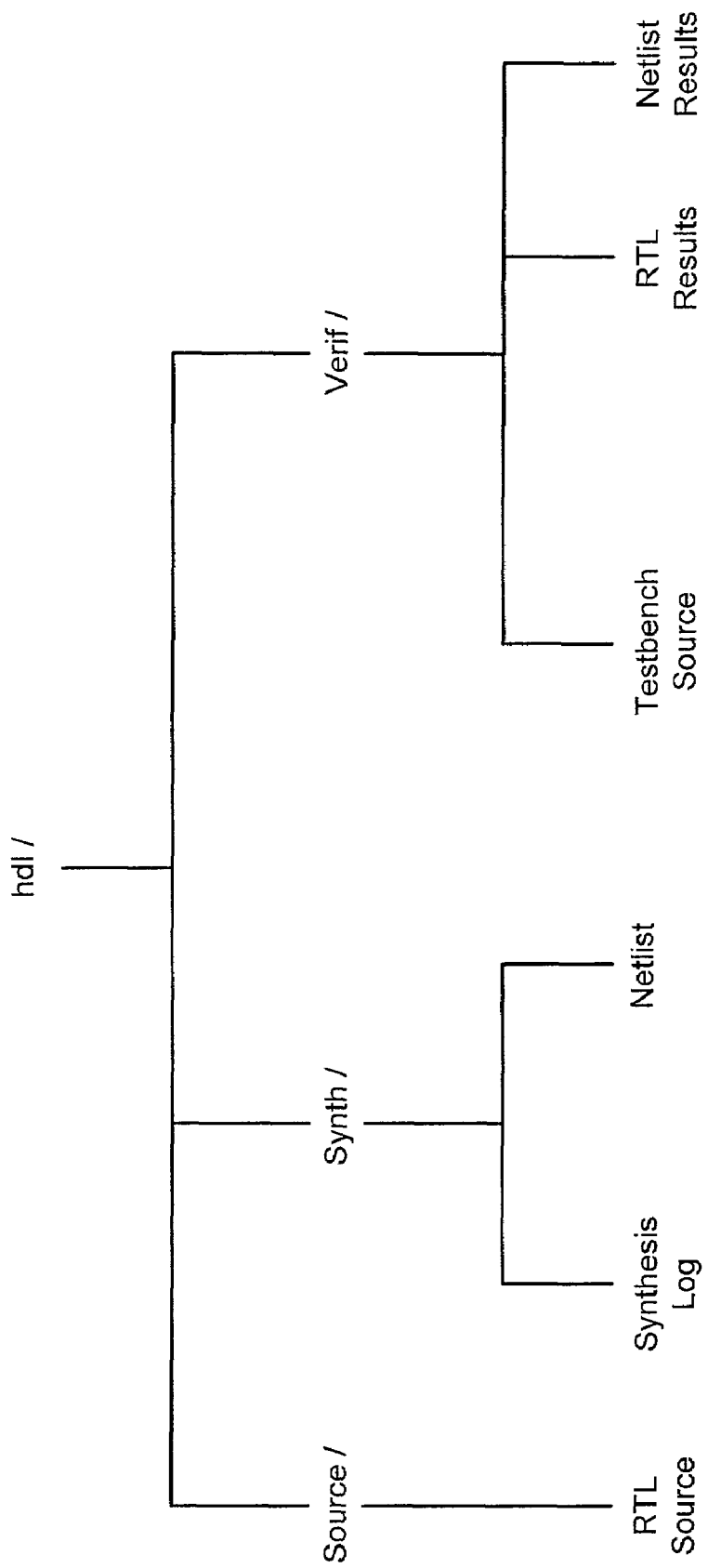
FIG. 1 illustrates a hdl library.

FIG. 1 illustrates an example of a library and shows the structure of a hdl library. The hdl library contains three sub-directories called source, synthesis and verify.

The source sub-directory contains register transfer level (RTL) source files which are the behavioural descriptions of the circuit described. These may be hand-written but contain automatically generated headers to indicate the last modification date of the file.

The synthesis directory contains the results of a synthesis run. Synthesis is a process which converts the behavioural RTL into circuit diagrams which implement the required behaviour. The circuit diagrams are saved in textual form as netlist files. The synthesis directory also contains a log of the synthesis run.

The verify directory contains verification information. This consists of the test bench (code to provide stimulus to the design being tested) and verification results for both the RTL and the netlist files. Both RTL and netlist files must pass verification to ensure the design is correct.

The design flow for producing the hdl library begins with writing the RTL source files. Afterwards the test bench source files are written and synthesis is carried out. During this stage the RTL files are processed to provide a netlist file and a synthesis log. Finally verification is carried out. At this stage the RTL files and the test bench files are processed to provide RTL verification results. The netlist files and test bench files are processed to provide netlist verification results.

The synthesis log contains dependency information linking the netlist files to the RTL source files. The verification directory contains dependency information linking the verification results back to the testbench, and to the respective netlist and/or RTL files.

Figure 2:
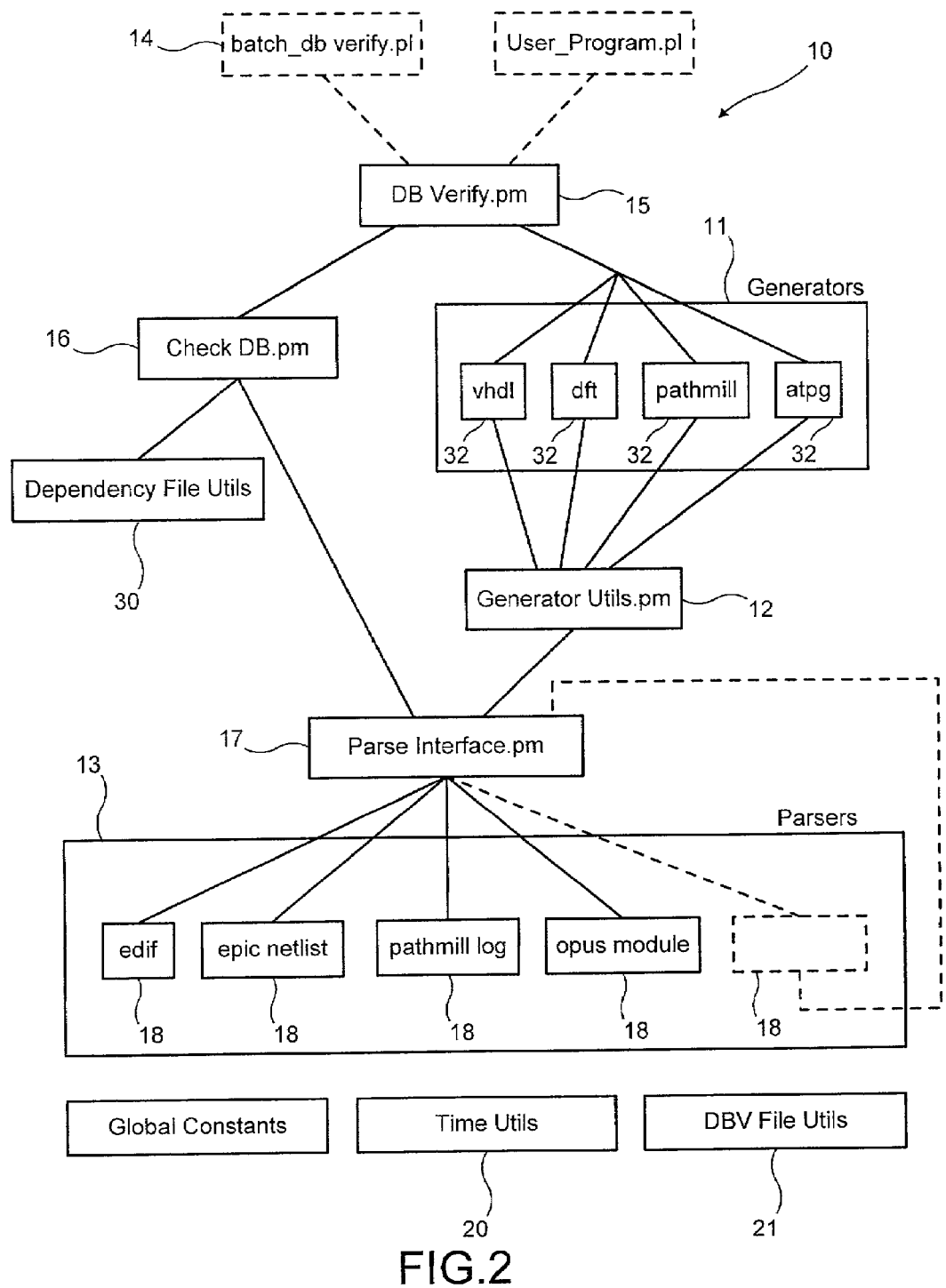
FIG. 2 illustrates schematically the internal program structure of the database validation system embodying the present invention.

FIG. 2 illustrates schematically a computer program which is run on a computer system to carry out a check on the files used in the design data base for creating the chip. It should be appreciated that in alternative embodiments of the present invention, circuitry can be used to implement the invention instead of a computer program.

The system embodying the invention, DBVerify, consists of three parts. These are the generators, parsers and core system. The core system is responsible for the overall control of the DBVerify system and does not need to be changed or customised for any design flow or library type.

The generator module 11 has a number of generators each of which is a module of code which is configured for a particular library type. Each library type has its own generator. Each generator "knows" the location of files within its associated library which contain dependency information, that is files which identify which files contain data which is dependent upon the data in one or other files in the library. The generators identify each file in its associated library which contain dependency information. Each generator 32 uses a common generator launch module 12 to generate a list containing an entry for each identified file. The entry for each file includes a first record identifying the file and a second record for each file upon which the identified file is dependent.

The parsers 13 make up the bulk of the DBVerify system. They are called by the core system to perform a particular action on a database file. The three possible actions that can be performed by a parser are "get time", "check contents" and "generate dependency".

Generate dependency is the process which reads in a file and extracts the dependency information from it. This information is written out to a dependency file in the directory containing the file. For example, there would be a dependency file in the synthesis directory of the hdl library linking the netlists back to the RTL source files. The dependency file also contains information about the type of the file, so that the core system knows how to extract information, such as the date of last modification, from it.

The second function performed by the parsers is get time. This simply reads the file and returns the date and time that it was last modified (or created) in a standardised format. This is then used by the core system to ensure that all the files are up-to-date.

The final function is check contents. This reads the file and checks for any problems. For example, it could check that there are no error messages in the synthesis log, or that the verification results show that the tests passed.

The various modules shown in FIG. 2 will now be described in more detail.

Command Interface Module(Batch _DBVerify.pl)14

This module 14 provides a command-line interface to the DBVerify database checking system, allowing the user to run the tool on a particular selected library.

Verification Module(DBVerify.pm)15

This module 15 provides the main top-level program of the database checking tool. It has two functions:

1. It launches off the correct dependency file generator subroutine for the library type. Each library type needs a different dependency file generator, as its library structure is different to any other. In alternative embodiments of the present invention, more than one library may use the same structure. The same file generator can be used for libraries of the same type. The filename and package name for the generator is created from the library data type, and the library is brought in at run-time, so that new generators which are written will just "plug in" to the existing structure without any modification of existing code.

2. It then searches the entire directory tree for each database area requested, looking for dependency files. When it finds a dependency file, it calls a process dependency file function from the checking module 16 to deal with it.

Checking Module(CheckDB.pm)16

This module 16 contains the routines to process a dependency file. The process dependency file routine uses the dependency file module 30 to read in the dependency file, and then processes each dependency record.

For each dependency record, the process dependency file routine retrieves the datestamp of the main file and the files on which it depends. It then checks that the main file is newer than all the other files, and prints an error message if this is not the case. The contents of both the main file, and all of the other files are also checked for errors. The process dependency file routine uses the get file date function to obtain the datestamps and the check file contents function to check the file contents for errors. Both of these later functions are obtained from parser interface (ParseInterface.pm) module 17. The actual date checking is performed by a check date function, which is in the checking module 16.

Generator Module 11

The generator module 11 contains the library-level dependency generators 32. The generators 32 "walk" around the library structure, and generate dependency information from the files they find. Each library filetype has its own generator. They use generator launch (GeneratorUtils) module 12 to launch the parser.

Generator Launch Module (GeneratorUtils.pm)12

This module contains the procedure—generate directory dependency file and is used by the generators to generate the list of files to pass on to the parser.

Parse Interfacemodule (ParseInterface.pm)17

This module 17 acts as a generic standardised interface to the many different file parsers. The function get file date is a routine to retrieve the datestamp from the specified file, the check file contents function is a routine to check the contents of the specified file for errors, and the generate dependency file function is a routine to generate a dependency file from the file supplied. Each parser is included on a "just-in-time" compile basis—the name of the file containing the parser is generated from the file type, and the parser is then included as necessary (a list of parsers which have already been compiled is also kept, to prevent multiple compilations).

The selection of the parsing routine is done by a method similar to dynamic dispatch. The functions compiled are placed into three tables, a get time table, a check file table and a generate dependency file table. When the parsing function is required, the correct routine is pulled out of the table and called.

Parsers module (Parser_*.pm)13

The parser module contains separate parsers 18 for the different file types. Each file type has a separate parser file, and these are all interfaced to the main program via the parser interface machine 17. Both the get date function and check contents function have the same parameter signature—the name of the file, followed by an optional list of "other parameters" from the dependency file to give the parser more information about the file.

The function generate dependency file takes the name of the dependency file to generate, the type of the files from which it is to generate the dependency file, and a list of all the files to use as sources of dependency information.

Each parser 18 must be separate to avoid clashes between procedure and variable names.

A number of other features are also provided in embodiments of the invention which are advantageous. These are set out below.

The system allows the user to add in extra parts to a dependency file by hand. This is accomplished by the user writing a .checkdb_dependencies.hand file in the directory where it is to reside. When the generate_depfiles tool sees this file, it will copy it in to the main autogenerated file, before generating the rest of the file.

The normal dependency file (.checkdb _dependencies) should not be edited by hand. It is completely overwritten by the generate_depfiles tool, and therefore any changes will be lost. The only way to make sure that hand-generated dependency information is kept is to place it in the .checkdb_dependencies.hand file.

The following is an example of a (fictitious) dependency file:

| | |
|---|---|
| file1.vhd vhdl_opus_header: | file2.edif edif, |
| | sch1 opus_schematic pti_tc_lib; |
| file3.diffcap epic_capacitance: | file4.cdl cdl_netlist; |

The above example shows that the file is called file1.vhd. It also shows that file1.vhd depends on file2.edif (which is of type edif) and sch1 (an OPUS schematic from a library called pti-tc-lib).

The third file, file3.diffcap, is an EPIC capacitance file, and depends on a fourth file file4 which is a CDL netlist. CDL netlist, EDIF netlist and Pathmill netlist are all types of netlist format. They are circuit diagrams expressed in a textual form. They all contain the same basic information, but using different syntax. Each tool requires the netlist in a different format, so multiple files are needed to support them.

An EBNF-style description of a dependency file is as follows:

EBNF stands for Extended Backus-Naur Form. It is used to specify the syntax of a programming language, configuration file, etc. in a form that is easy to understand, succinct and unambiguous.

The items in bold in the EBNF-style description are the final lexical identifiers, and therefore need no further derivation.

Either the date check, or the content check, or both checks may be skipped for a particular file. This is accomplished by adding the extra parameter no_date or no_content to the file's record in the dependency file. Note that these options must be used with care, as they circumvent the tool's checks.

There are very few circumstances where these options would be used. An example would be where the user is not interested in checking the contents of a file, just that it is up-to-date. Its main intended use is for developers so that if a new parser has not been fully developed, some checks which would otherwise produce errors, can be circumvented.

The DBVerify system is extendable and is written in such a way that extra library types and filetypes could be added by the user or database administrator in a global or site-specific way.

In particular each library datatype has a different directory structure. For example, the structure and contents of a vhdl library is very different to a pathmill library. DBVerify needs to know how a library is supposed to be layed-out before it can attempt to check it.

A library generator should be placed in a file called LibGen_<datatype>.pm. It should contain a package called LibGen_<datatype>.pm and should use the ParseInterface module. The top-level procedure should be called generate_lib_depfiles. The package should not export any symbols (ie it must not have an "import" procedure), to avoid any symbol clashes with other packages. These rules are put in place to enable new generators to be added without modifying any of the existing code—the new generators just "plug" themselves in automatically once they are put on the PERLLIB search path (environment variable).

The generate_lib_depfiles routines should take one argument—the full path to the base of the library (including datatype and version). The generator should walk around the database, and use calls to generate_directory_depfile to generate the dependency file.

The parameters to generate_directory_depfile are as follows:

1. Directory in which to generate the dependency file (use the library root directory to generate the full path).
2. Type of file which contains the dependency information.
3. Regular expression describing the files from which the dependency information should be derived.

To illustrate this, it is possible to generate dependency information from epic netlist files in a pathmill area. A pathmill area is another library type (like an hdl library), but contains information relating to a different aspect of the

| | |
|---|---|
| dependency_file | = [dependency_record] |
| dependency_record | = main_file_info ":" sub_file_info [","  sub_file_info] ";" |
| main_file_info | = main file filenamemain_file filetype [(main_file_other_param)] |
| sub_file_info | = sub_file_filename sub_file_filetype  [(sub_file_other_param)] | design. In this case, it contains files relating to the use of the PathMill tool. The call to generate_directory_depfile should be made as follows:

generate_directory_depfile("$library_root/$module_name", "epic_netlist", "\\.epic\S");

The effect of this call is to search the directory $library_root/$module_name, and generate dependency information from all the files ending in ".epic". (The "." is escaped with a double backslash because one backslash is stripped off by the compiler when processing the string, leaving one remaining backslash to escape the period. This is needed because, in PERL regular expressions, a period matches any character, so we escape it to make sure that it only matches itself. The dollar sign matches the end of the string in PERL regular expressions (hence the above will only match files ending in ".epic". The dollar sign needs a backslash to stop the compiler assuming that it signifies the start of a variable which it has to substitute.

Each file datatype in a particular directly requires a separate call to generate_directory_depfile. Once all the dependency information has been retrieved, the generator can return back to the main program.

If the generator should encounter any errors in the database which would indicate that there is a problem (and therefore the library should not be released), then it must exit with an error, using the die procedure.

Note that the generator should simply "walk" around the database looking for files which should contain dependency information. The job of reading the files is done by the parser, not the generator.

Many different filetypes exist in a database. Each one requires a different file parser to extract its data.

A parser performs three functions (although not all of them need to be implemented):

1. Get the datestamp time for the file.

This can be as simple as returning the UNIX datestamp, or it may require reading the actual file to retrieve the internal datestamp.

2. Check the file's contents.

This involves reading a file to check that no predefined rules are broken. For example, read a Pathmill report file to check that there was no negative slack in any paths. When a chip is clocked at a particular speed it has to do something every clock cycle. There is only a certain amount of time within each clock cycle in which it is able to do these things, and a check is carried out that the chip is not having to do too much within a single cycle. For this, PathMill is used which works out exactly how much time everything in the chip takes, and checks that this is less than the clock period. The "slack" is the amount of time left spare; if the slack is negative, then the design is not fast enough, and will not work when it is manufactured.

3. Generate dependency information.

Some files contain information about dependency links. The dependency generator extracts this information, and writes it to a dependency file.

All parsers need to have an overall defined structure. This is as follows:

The parser is contained in a file called Parser <filetype>.pm, and is placed in the PERL include path. PERL is the programming language used to implement DBVerify. The separate files making up the DBVerify system are pulled together by the PERL system, which needs to know where to find these files. The PERL include path is how to tell PERL where to look for these files. It is similar in operation to the PATH variable in DOS.

The file contains one package, called Parser <filetype>(eg Parser_epic_netlist). The package must not export any symbols (ie it must not have an "import" procedure), to avoid any symbol clashes with other packages.

The three functions of each parser have standardised names—get_time, check_contents and generate_depfile.

These rules are in place to simplify the adding of new parsers —when new code is written, it simply "plugs" itself in, without needing any modification to the existing code.

The get_time function retrieves the timestamp information from the file and returns it to allow dependency checking. The function is passed the name of the file to read, along with any other optional parameters defined in the dependency file. It should return a datestamp in the standard UNIX format—the number of seconds elapsed since 00:00:00, Jan. 1, 1970. If it fails, it should return a value of −1 to indicate an error, or bomb out with the die function. Various datestamp-manipulating functions are provided in the TimeUtils package 20, in addition to the ones provided by the standard PERL library.

The check_contents function is used to verify that the contents of a file are correct. Its parameters are the same as the get_time function, and it should return 0 for a pass and 1 or more for a fail. This routine may be written in a language other than PERL, but must be interfaced to DBVerify using a normal parser "wrapper", written in PERL.

The generate_depfile function generates dependency information from a list of files. It takes the following arguments:

1. The filename of the dependency file to generate
2. A list of files from which to generate the dependencies The dependency file should be opened in APPEND mode, to avoid overwriting any dependency information already written by another parser. All dependency files are cleared at the start of the run, so there will not be any stagnant information left from a previous run. There are a number of ways of opening a file—Read and Write (and also Read-Write). There are also two ways of opening a file for writing—Overwrite and Append. Opening a file in overwrite mode will remove the existing contents of the file, then writing the file from the beginning will start again. Opening in Append mode does not delete the existing contents, and will start writing at the end of the existing file.

The return value of the function is not tested. If an error is encountered, the die function should be used to abort the run.

There is a special program to check the generate_depfile function of a new parser, called test_depfile_gen.pl. It takes three or more arguments—the name of the dependency file to generate, the type of the file which should be parsed, and then a list of the files which should be parsed. It then generates the dependency file, and this can then be checked by hand. test_depfile_gen.pl uses the standard DBVerify method of interfacing to the parser, so it will also check that the new parser has been properly connected to the DBVerify system.

The DBVFileUtils module 21 provides three routines:

1. dbv_openfile takes one argument—a string describing the name of a file to open. It then opens this file in read-only mode, and returns a scalar value representing a filehandle which corresponds to this file.

If the file does not exist, but has been compressed with gzip or compress, then the appropriate decompression utility will be used to decompress the file on-the-fly. In this case, the filehandle returned corresponds to the input pipe from the decompression utility. Because of this the fseek and ftell operations (and other, similar, operations) should never be used on filehandles returned by dbv_openfile—if the programmer wishes to rewind a file, it must be closed and then reopened. Gzip and compress are UNIX file compression utilities, like PKZIP or WinZIP under DOS/Windows. fseek and ftell are system calls used to move around a file to read/write bits of the file in random order. Without fseek/ftell it would only be possible to write the file in linear order.

2. dbv_closefile takes one argument—a filehandle value returned by dbv_openfile, and performs the necessary operations to close the file, and/or close any decompression utilities associated with the filehandle.

3. get_unix_file_time takes one argument—the name of a file—and returns its UNIX modification timestamp. It also works if the file has been compressed.

This module provides the DBVerify system with a standardised interface for opening files in a database, whether they are left in their standard form, or compressed, dbv_openfile should always be used in preference to open (or other standard PERL file opening commands), to ensure that the functionality remains throughout the PERL system.

Note that dbv_openfile will only work for files opened in read-only mode. To open a file in append or write mode, the standard PERL open should be used.

The file template_parser.pl provides a template framework around which a new parser can be written. It is well commented, and contains templates for all three parser functions.

The file GenericParser.pm provides a routine for finding a standard UNIX "date"-style datestamp in a file. The parameter list is documented in the file comments.

Figure 3:
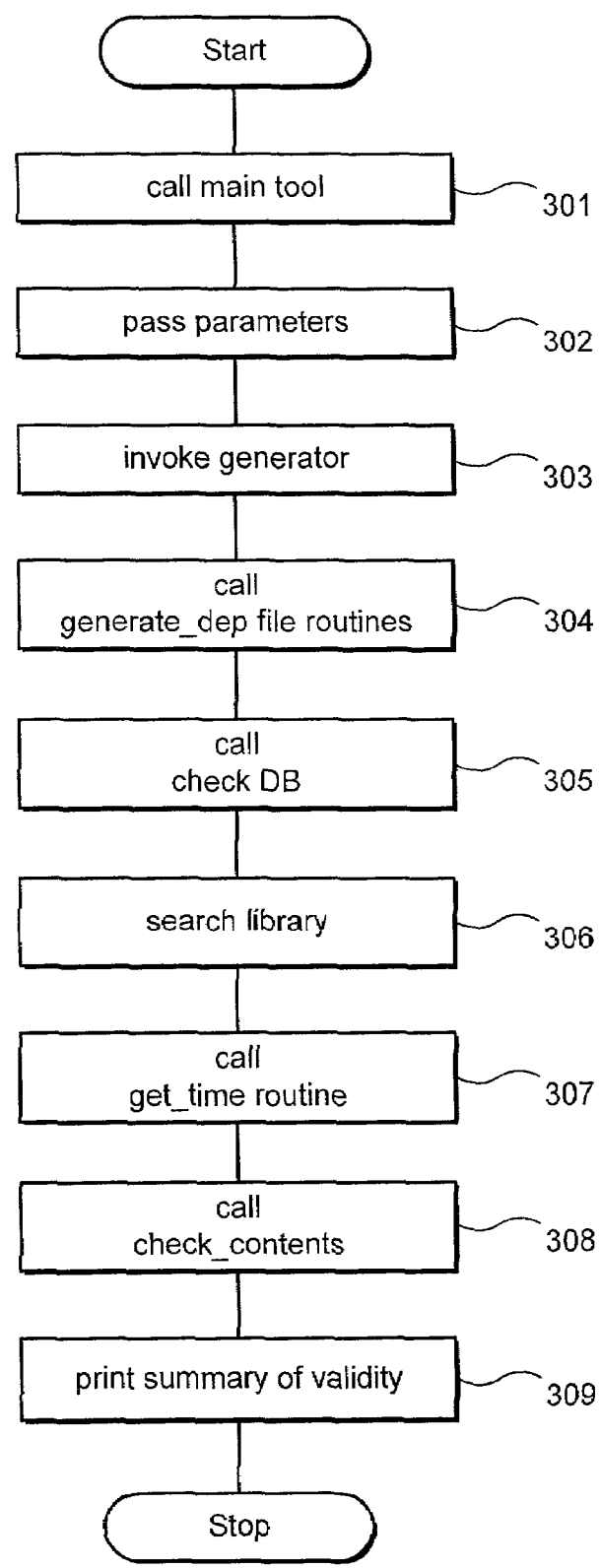
FIG. 3 shows a flow diagram illustrating operation of the database validation system embodying to the present invention.

The operation of DBVerify will now be described with reference to FIG. 3.

Firstly the main tool (DBVerify) is called 301 by the core system. Next the parameters identifying the library types are passed 302. This includes details of the library type and library location.

Next the core system invoices the generator for the particular library type 303 The library generator then calls the core system (via generator Utils) to extract dependency information from the synthesis log, RTL results and netlist results. The core system then calls the generator_depfile routines 304 from the relevant parsers for each of the files thereby generating the dependency files. routines 304 from the relevant parsers for each of the files thereby generating the dependency files.

Once all of the dependency files have been generated the DBVerify program calls CheckDB 305 to check the database. CheckDB searches 306 a library for dependency files and when it finds one it reads it to determine which files to check. The dependency file contains a list of files having a record for each identified file which contains data which is dependent on the data held in another second file, together with a record of the names of files on which they depend, along with the format of each file.

For each dependency link in the database, CheckDB uses the get time routine 307 in the relevant parsers (via ParseInterface) to determine the last modification date of both ends of the link, and checks that the dependent file is up to date. It also uses the check_contents routine 308 to ensure that the contents of the file are also valid.

Once the whole database has been checked in order to validate the data in the files DBVerify prints a summary report 309 indicating whether the checks passed or failed.

In this way the computer system is operable to generate electronic data indicative of the validity of the data files stored in the computer. The program may be recorded on a computer readable medium which when the program is loaded into a computer makes the computer execute procedure to validate the data files stored in the computer. The computer program product comprising the computer readable medium may be downloaded onto various types of computer.

In summary the computer system operates to check the validity of data in a library or data store in a database. For each library in the database which is to be checked a file generator, or file locator, associated with that library type locates files which contain dependency information.

A file reader associated with the file type of the located file then reads details out of the located file to thus identify dependent files in the library. These are those files which contain data which is dependent upon the data in one or other files in the library. These other files are also identified. For each identified file details of the file are read by the file reader. The details read out may include the file name, file type and dependency links. These details are stored as a record in an entry of a list which is generated in the library being checked. An entry is made for each identified dependent file. Each entry includes a record for the identified dependent file and a record for each identified other file upon which it depends.

Next for each identified file (which has a record in the generated list) a file reader associated with that identified file reads out a predetermined parameter of the file, for example the date stamp, under the control of a checking portion of the system.

A comparison is then made between the predetermined parameter of the identified dependent file with the corresponding parameter from each identified other file, ie of each file upon which the identified dependent file depends. Responsive to this comparison the validity of the data in the files can be checked and thereby validated.

The benefits provided by DBVerify are that library dependency checking which used to a laborious manual process and which was performed only once just before a chip was produced is now made an automatic process which can be done as often as required. Additionally the code related to the library structure is kept apart from the code related to reading the file. This means that introducing a new library structure is simplified as all the parsers can be reused. Furthermore adding new parsers/generators is very simple so that DBVerify can easily be customised for a particular design methodology. The new code simply needs to be written and placed in a particular position and it will be automatically inserted into the system. No changes need to be made to the core system so that it can remain standard throughout all installations. In addition all of the flow specific code is separated from the core system. This means that the system is easily customisable to any design flow without any modifications being required to the central code. A design flow is a combination of tools and library structure used by an organisation to design chips. It defines which tools are to be used for each stage of the design process, and where the input and output files for each stage should be placed.

It will be appreciated by those skilled in the art that various modifications can be made to the above described example without departing from the scope of the present invention.

The invention claimed is:

1. A method of operating a computer system to validate data defining a design of an integrated circuit, the method comprising:
   storing said data in a plurality of data files in a database each of said data files having an associated file type and being arranged in a plurality of data stores in said database, each of said data stores relating to a different aspect of said design, wherein at least one of said data files is a data dependent file containing data dependent on data in one or more other of said data files;
   selecting a file locator which is associated with a respective one of said data stores in said database relating to a respective one of said aspects of the design;
   using said selected file locator to identify a first data dependent file from said data files and to identify one or more other of said data files upon which said first data dependent file depends;
   for each of said identified files, selecting a first file reader associated with file type of the identified files;
   using said selected first file reader, determining a timestamp indicating the time of last modification of said identified files;
   comparing the timestamp from the first data dependent file with that from each other identified file; and
   after when determining, based on the act of comparing, that the timestamp from the first data dependent file is same as or later than the timestamp from each other identified file, providing an output signal for each identified data file, indicating that the identified data file is valid for use in manufacture of said integrated circuit.

2. The method according to claim 1, wherein identifying files comprises:
   locating, via said file locator, files which contain dependency information;
   for each located file, selecting a second file reader associated with the file type of the located file; and
   via said second file reader identifying said first dependent file and each other file on which the first file depends.

3. The method according to claim 1 further comprising:
   for each data store generating a list therein containing an entry for each first dependent file in the data store, said entry including a first record having details of the first dependent file.

4. The method according to claim 3, wherein each entry in said list further includes a further record for each other identified file upon which the dependent file depends.

5. The method according to claim 1 further comprising:
   selecting the file locator from a file locator means which contains a plurality of file locators; and
   selecting a file reader from file reader means which contain a plurality of file readers.

6. The method according to claim 1, wherein said timestamp comprises the date on which the data file was last modified.

7. The method according to claim 1, wherein said timestamp is a UNIX date stamp.

8. The method according to claim 1 further comprising:
   identifying every said first dependent file in said data store.

9. The method according to claim 1, wherein said data store is a database library.

10. The method of claim 1, wherein each of the plurality of data stores is of a different type and wherein the step of selecting a file locator further comprises:
    selecting a different file locator for each store of a different type.

11. A computer system arranged to validate data defining a design of an integrated circuit, the computer system comprising:
    a memory; and
    a processor, coupled to the memory, configured to:
    store said data in a plurality of data files in a data base in the memory, each of said data files having an associated file type and being arranged in a plurality of data stores in said database, each of said data stores relating to a different aspect of said design, wherein at least one of said data files is a data dependent file containing data dependent on data in one or more other of said data files;
    identify a first data dependent file from said data files in said associated data store and one or more other of said data files in said data base upon which said first data dependent file depends;
    determine a timestamp indicating the time of last modification for each identified file;
    compare the timestamp determined for said first data dependent file, with the timestamp determined for each other identified file; and
    after when determining, based on the comparison, that the timestamp from the first data dependent file is same as or later than the timestamp from each other identified file, output a signal for each identified file which indicates that it is valid for use in manufacture of said integrated circuit.

12. The computer system according to claim 11, wherein each data store stores at least one file which can be located and which contains dependency information which enables dependent files and said other files in the data store to be identified; and wherein the processor is configured to locate said located file.

13. The computer system according to claim 12,
    wherein the processor is configured to provide a list in the data store, said list having an entry for each dependent file having details contained in the located file and including a record in said entry for said dependent file together with a further record for each other file upon which the dependent file depends.

14. The computer system according to claim 11, wherein said timestamp comprises the date on which the date file was last modified.

15. The computer system according to claim 11, wherein said timestamp is a UNIX date stamp.

16. The computer system according to claim 11, wherein said data store is a database library.

17. The computer system of claim 11, wherein each of the plurality of data stores is of a different type.

18. A computer readable medium, having a program recorded thereon, where the program is to make the computer perform a method to validate data defining a design of an integrated circuit, the method comprising:
    storing said data in a plurality of data files in a database each of said data files having an associated file type and being arranged in a plurality of data stores in said database, each of said data stores relating to a different aspect of said design, wherein at least one of said data files is a data dependent file containing data dependent on data in one or more other of said data files;
    selecting a file locator which is associated with a respective one of said data stores in said database relating to a respective one of said aspects of the design;

using said selected file locator to identify a first data dependent file from said data files and to identify one or more other of said data files upon which said first data dependent file depends;

for each of said identified files, selecting a first file reader associated with file type of the identified files;

using said selected first file reader, for each identified file, determining a timestamp indicating a time of last modification of the identified files;

comparing the timestamp from the first data dependent file with that from each other identified file; and after when determining, based on the act of comparing, that the timestamp from the first data dependent file is same as or later than the timestamp from each other identified file, providing an output signal for each identified data file indicating that the identified data file is valid for use in manufacture of said integrated circuit.

19. The computer readable medium of claim 18, wherein said step of identifying files comprises:

locating, via said file locator, files which contain dependency information;

for each located file, selecting a second file reader associated with the file type of the located file; and via said second file reader identifying said first dependent file and each other file on which the first file depends.

20. The computer readable medium of claim 18, wherein the method further comprises:

for each data store generating a list therein containing an entry for each first dependent file in the data store, said entry including a first record having details of the first dependent file.

21. The computer readable medium of claim 20, wherein each entry in said list further includes a further record for each other identified file upon which the dependent file depends.

22. The computer readable medium of claim 18, wherein the method further comprises:

selecting the file locator from a file locator means which contains a plurality of file locators; and selecting a file reader from file reader means which contain a plurality of file readers.

23. The computer readable medium of claim 18, wherein said timestamp comprises the date on which the data file was last modified.

24. The computer readable medium of claim 18, wherein said timestamp is a UNIX date stamp.

25. The computer readable medium of claim 18, wherein the method further comprises:

identifying every said first dependent file in said data store.

26. The computer readable medium of claim 18, wherein said data store is a data base library.

27. The computer readable medium of claim 18, wherein each of the plurality of data stores is of a different type and wherein the step of selecting a file locator further comprises: selecting a different file locator for each store of a different type.

* * * * *